United States Patent
Zhang et al.

(10) Patent No.: US 10,163,914 B2
(45) Date of Patent: Dec. 25, 2018

(54) METHOD OF REDUCING FIN WIDTH IN FINFET SRAM ARRAY TO MITIGATE LOW VOLTAGE STRAP BIT FAILS

(71) Applicant: GLOBALFOUNDRIES Inc., Grand Cayman (KY)

(72) Inventors: Xiaoqiang Zhang, Clifton Park, NY (US); Hui Zang, Guilderland, NY (US); Ratheesh R. Thankalekshmi, Clifton Park, NY (US); Randy W. Mann, Milton, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/603,827

(22) Filed: May 24, 2017

(65) Prior Publication Data
US 2018/0261605 A1    Sep. 13, 2018

Related U.S. Application Data

(60) Provisional application No. 62/470,223, filed on Mar. 11, 2017, provisional application No. 62/469,774, filed on Mar. 10, 2017, provisional application No. 62/468,809, filed on Mar. 8, 2017.

(51) Int. Cl.
*H01L 29/66* (2006.01)
*H01L 27/11* (2006.01)

(52) U.S. Cl.
CPC .... *H01L 27/1104* (2013.01); *H01L 29/66545* (2013.01); *H01L 29/66818* (2013.01)

(58) Field of Classification Search
CPC ............. H01L 29/66795; H01L 29/785; H01L 27/0924; H01L 21/845; H01L 21/34; H01L 27/1203; H01L 27/1207; H01L 27/1211; H01L 29/045; H01L 29/1054; H01L 29/66818; H01L 21/31144; H01L 29/6681; H01L 27/10879
USPC ......................................................... 438/283
See application file for complete search history.

(56) References Cited

U.S. PATENT DOCUMENTS

| | | | |
|---|---|---|---|
| 6,642,090 B1 * | 11/2003 | Fried ............... | H01L 21/823828 |
| | | | 257/E21.635 |
| 2005/0051825 A1 | 3/2005 | Fujiwara et al. | |
| 2011/0039380 A1 * | 2/2011 | Blomme .......... | H01L 21/28273 |
| | | | 438/264 |

(Continued)

*Primary Examiner* — Caleen Sullivan
(74) *Attorney, Agent, or Firm* — Francois Pagette; Hoffman Warnick LLC

(57) ABSTRACT

A method of reducing fin width in an integrated circuit (IC) including oxidizing an exposed portion of at least one fin in an array of fins resulting in a reduction in the width of the exposed portion of the at least one fin. A first hard mask may be located over the array of fins except the exposed portion of the at least one fin during oxidation. A second hard mask may be optionally located over the array of fins, under the first hard mask, and covering a portion of the exposed portion of the at least one fin during the oxidizing of the exposed portion of the at least one fin. The oxidizing the exposed portion of the at least one fin may occur before forming a shallow trench isolation (STI) between pairs of fins in the array of fins, after forming the STI between the pairs of fins in the array of fins, and/or after removing a dummy gate during a replacement metal gate process.

14 Claims, 8 Drawing Sheets

(56) References Cited

U.S. PATENT DOCUMENTS

2014/0353731 A1   12/2014  Colinge et al.
2018/0053824 A1*  2/2018  Wang .................. H01L 29/1037

* cited by examiner

METHOD OF REDUCING FIN WIDTH IN FINFET SRAM ARRAY TO MITIGATE LOW VOLTAGE STRAP BIT FAILS

This application claims priority to U.S. Provisional Application No. 62/468,809, filed Mar. 8, 2017; U.S. Provisional Application No. 62/469,774, filed on Mar. 10, 2017; and U.S. Provisional Application No. 62/470,223, filed on Mar. 11, 2017.

BACKGROUND

The present disclosure relates to semiconductor device fabrication, and more specifically, to methods of reducing fin width, for example to mitigate low voltage strap bit fails.

With increasing miniaturization of electronics, non-planar fin-shaped field effect transistors (FinFETs) are increasingly incorporated into devices such as static random access memory (SRAM) bitcell arrays, logic devices, etc. Towards the end of semiconductor device formation, e.g. SRAM bitcell formation, termination boundaries of an array of such devices may be established, for example in the bit-line (BL) direction and in the wordline (WL) direction. Conventional termination techniques, such as "strap" design, are designed to preserve bitcell layout consistency and homogeneity in the electrical characteristics of the bitcells of the devices. One result of conventional array termination includes a systematic device offset, e.g. systematic strap proximity effect (SPE), which includes increased read currents in bitcells near the strap, decreased cell stability, decreased pull down (PD) and/or pass gate (PG) threshold voltage (VT), and increased low voltage fail count for adjacent strap region bitcells.

SUMMARY

A first aspect of the disclosure is directed to a method of reducing fin width in an integrated circuit (IC), the method including: oxidizing an exposed portion of at least one fin in an array of fins, wherein a first hard mask is located over the array of fins except the exposed portion of the at least one fin, and wherein the oxidizing reduces the width of the exposed portion of the at least one fin.

A second aspect of the disclosure includes a method of reducing fin width in an integrated circuit (IC), the method including: forming a first hard mask over an array of fins of a substrate; removing a portion of the first hard mask to expose an exposed end portion of at least one fin of the array of fins, wherein the exposed end portion of the at least one fin is located within a strap region of the array of fins; oxidizing the exposed end portion of the at least one fin, wherein the oxidizing causes a first reduction in a width of the exposed end portion of the at least one fin; and removing a remaining portion of the hard mask from the array of fins.

A third aspect of the disclosure includes an SRAM bitcell array structure including at least one fin in an array of fins in a substrate, wherein a width of a first portion of the at least one fin is less than a width of a second portion of the at least one fin in the array of fins.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Figure 1:
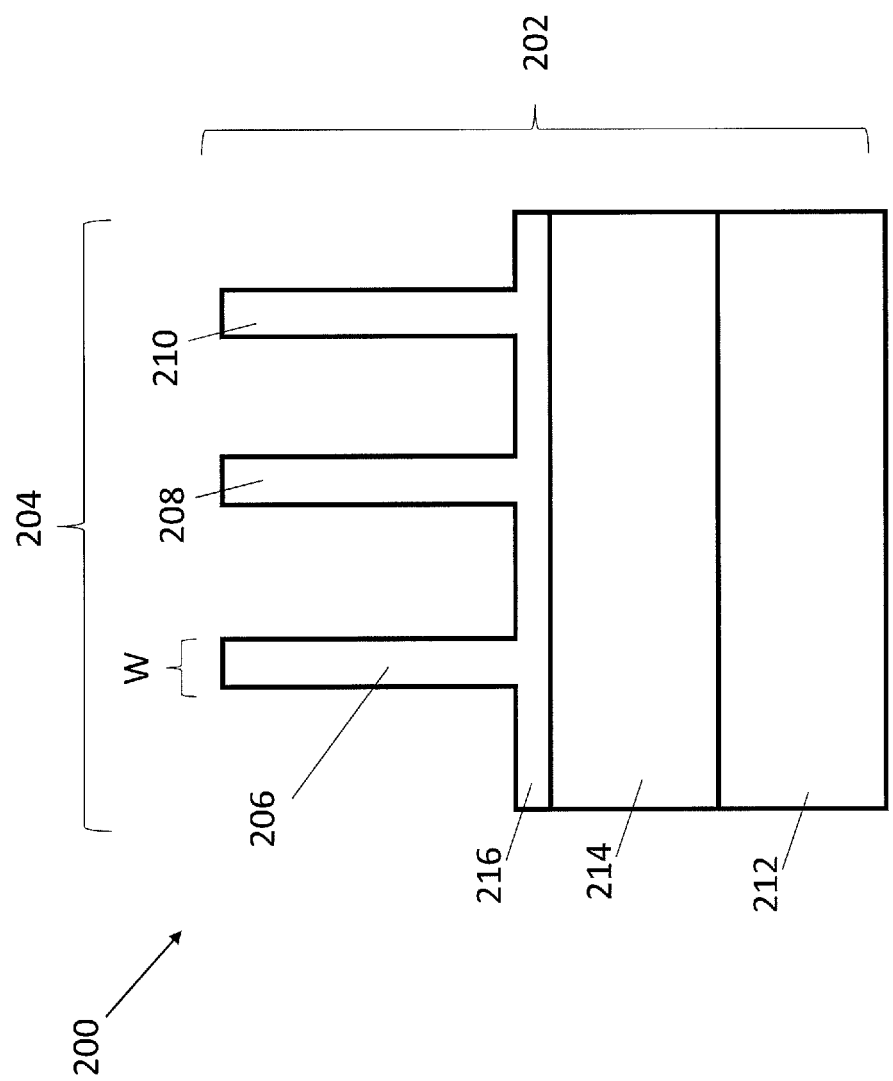
FIG. 1 shows a cross-sectional view of an example of an initial semiconductor structure with an array of fins for reducing the width of a portion of a set of fins in a strap region according embodiments of the disclosure.

FIG. 1 shows a cross-sectional view of an initial structure 200 of a semiconductor structure for a method of reducing the thickness of a portion of a set of fins 206, 208, 210 in a strap region 402 (see FIG. 5) to mitigate low voltage strap bitfails in an SRAM bitcell array device 400 (hereinafter, "SRAM array") (see FIG. 5). At this stage, initial structure 200 is provided including a substrate 202 with fin array 204 including fins 206, 208, 210. An end of fins 206, 208, 210 may be located for example within strap region 402 (see FIG. 5) of fin array 204 of SRAM array 400 (see FIG. 5). Fins 206, 208, 210 may for example include only N fins. Strap region 402 (see FIG. 5) may include for example the edge or boundary of SRAM array 400 (see FIG. 5). In another example, an end of fins 206, 208, 210 may be located at any desirable location within SRAM array 400 (see FIG. 5) for reducing width (W) of the fin. Substrate 202 may include a semiconductor base substrate 212, an insulator layer 214 and a semiconductor-on-insulator (SOI) layer 216.

Semiconductor base substrate 212 and SOI layer 216 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of each layer may be strained. For example, SOI layer 216 (and/or epi layer thereover) may be strained.

Insulator layer 214 may include any now known or later developed dielectric used for SOI layers, such as but not limited to silicon dioxide or sapphire. As noted, the choice of insulator depends largely on intended, application, with sapphire being used for radiation-sensitive applications and silicon oxide preferred for improved performance and diminished short channel effects in microelectronics devices. The precise thickness of insulator layer 214 and topmost SOI layer 216 also vary widely with the intended application.

Initial structure 200 may be formed using any now known or later developed semiconductor fabrication techniques including by not limited to photolithography (and/or sidewall image transfer (SIT)). In lithography (or "photolithography"), a radiation sensitive "resist" coating is formed, e.g., deposited, over one or more layers which are to be treated, in some manner, such as to be selectively doped and/or to have a pattern transferred thereto. The resist, which is sometimes referred to as a photoresist, is itself first patterned by exposing it to radiation (e.g. by a photo-etching-process (PEP)), where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

Where materials are deposited, "depositing" may include any now known or later developed techniques appropriate for the material to be deposited including but not limited to: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

While fin array 204 is shown to include three fins 206, 208, 210 in FIG. 1, it is understood that any number of fins desirable for the SRAM array 400 (see FIG. 5) may be formed.

At this stage in conventional processing, a shallow trench isolation (STI) (such as STIs 240 of FIG. 3) would be formed between fins 206, 208, 210, for example between fins 206, 208 and between fins 208, 210. The remainder of the semiconductor structure would then be formed, by conventional processing, and termination boundaries (e.g. boundaries 412, 414 of FIG. 5) of the SRAM array 400 (see FIG. 5) established, for example by "strap" design techniques. When the termination boundaries are eventually formed, systematic strap proximity effect (SPE) may result, including increased read currents in bitcells near the "strap" (see FIG. 5, strap region 402), decreased cell stability, lower pull down (PD) and/or pass gate (PG) threshold voltage (VT), and increased low voltage fail count for adjacent strap bitcells.

Figure 2:
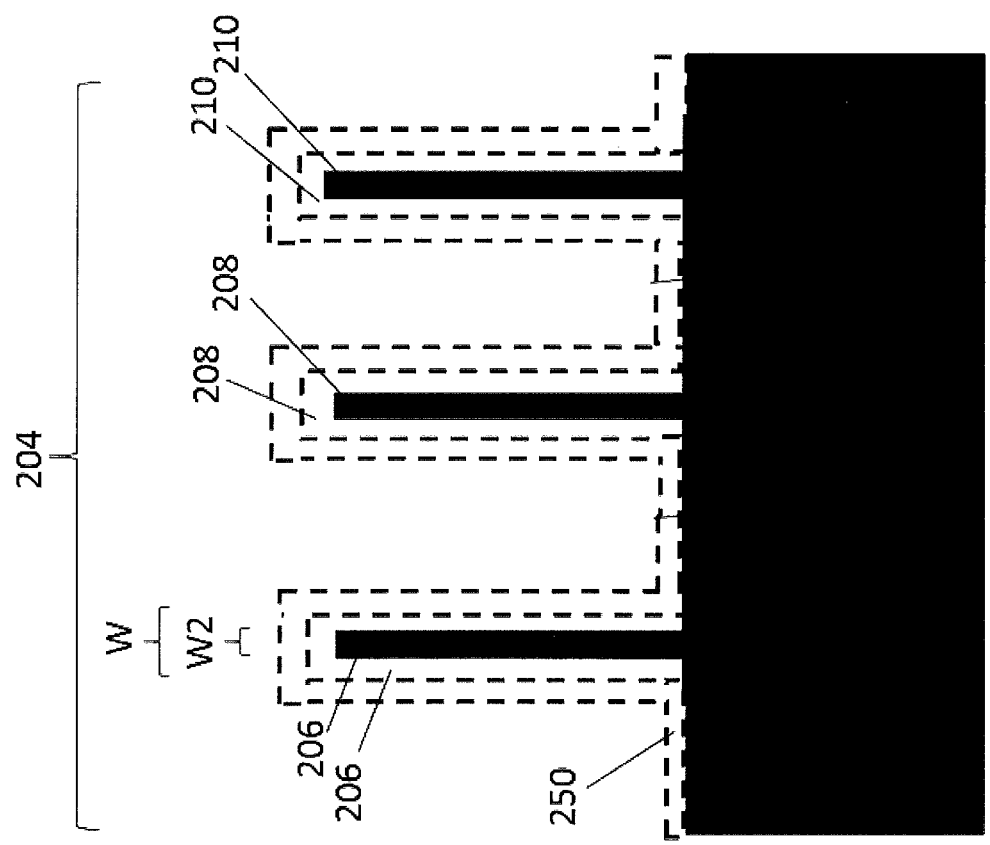
FIG. 2 shows a cross-sectional view of an example of an initial semiconductor structure with an array of fins, including reducing the width of a portion of a set of fins in a strap region according embodiments of the disclosure.
Figure 4:
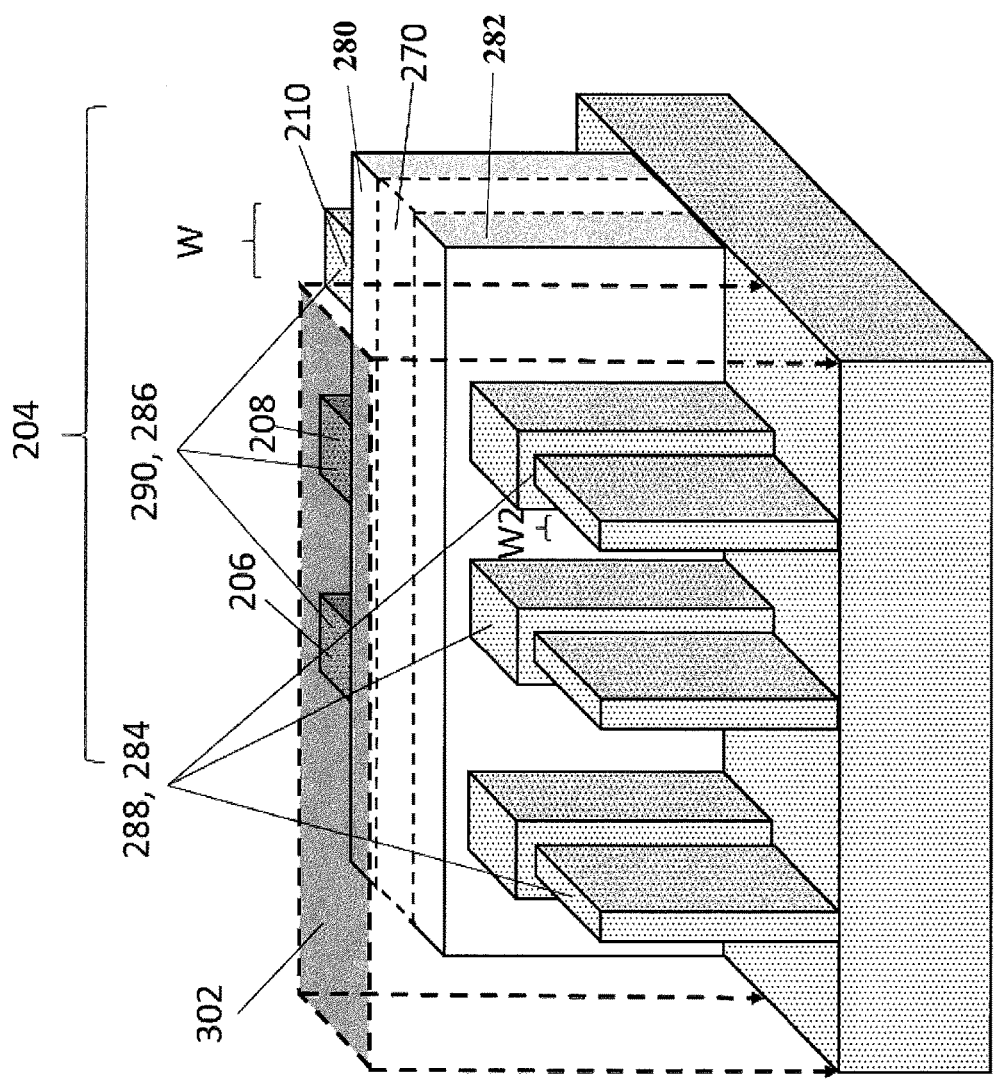
FIG. 4 shows a cross-sectional view of the portion of the initial semiconductor structure of FIG. 1 including further processing and reducing the width of a portion of a set of fins in a strap region after removing a dummy gate stack during a replacement metal gate process according to embodiments of the disclosure.
Figure 5:
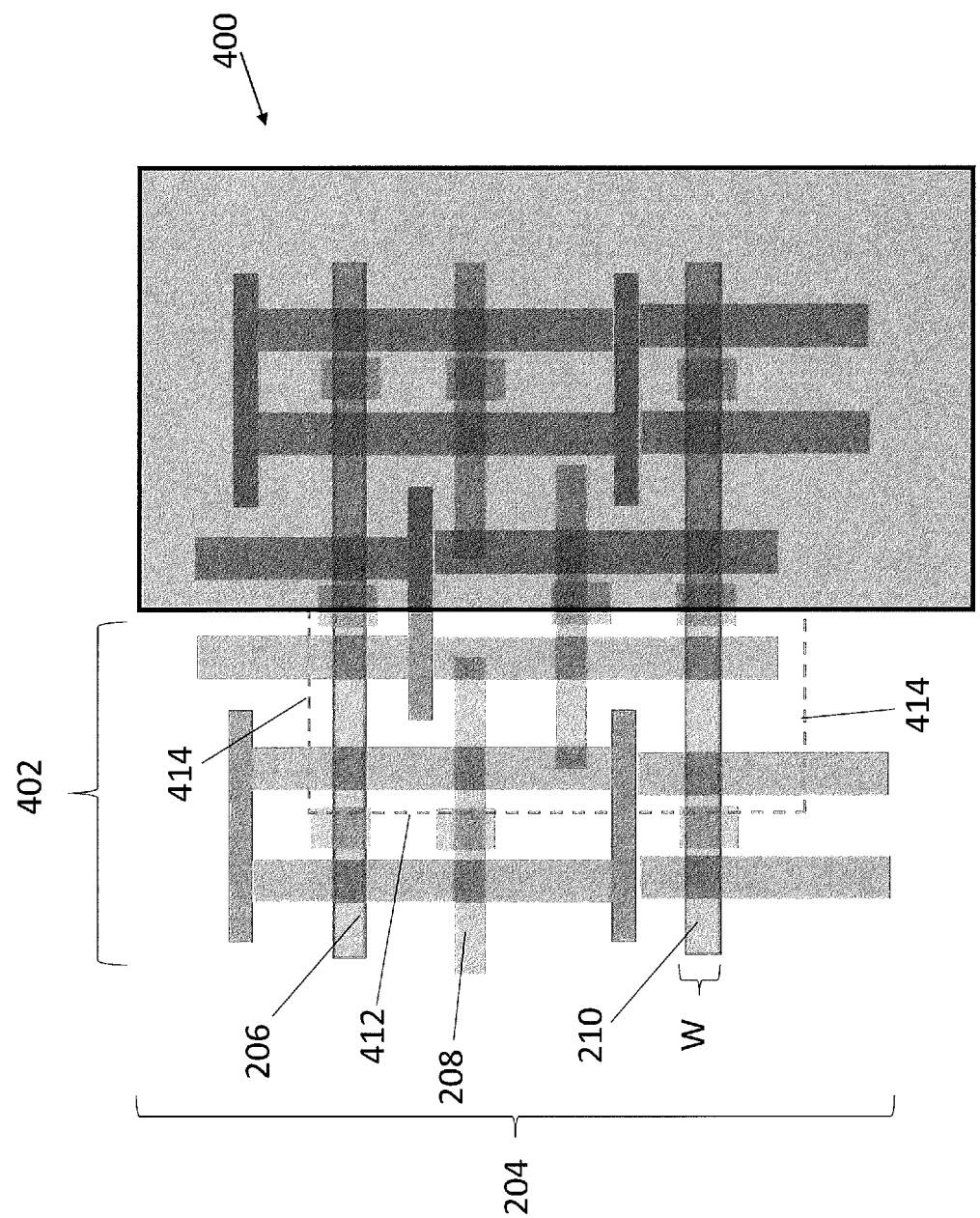
FIG. 5 shows a top view of a portion of an SRAM bitcell array according to embodiments of the disclosure.

As shown in FIG. 2, in contrast to conventional processing, an embodiment of the disclosure includes a first reduction of width (W) of an end of fins 206, 208, 210 in strap region 402 (see FIG. 5). FIG. 2 shows forming a hard mask 220 over initial structure 200 including substrate 202 and fin array 204. Hard mask 220 (in phantom) may be formed, for example, by deposition or any other now known or later developed technique for forming hard masks in semiconductor manufacturing. Hard mask 220 (in phantom) may then be patterned to create an oxidation region 302 (see FIG. 4), for example over a portion of the ends of fins 206, 208, 210 in strap region 402 (see FIG. 5), while remaining intact over the remainder of fins 206, 208, 210. For example, patterning of hard mask 220 (in phantom) may create exposed end portions of fins 206, 208, 210. For example, fins 206, 208, 210 may include N fins, and P fins (not shown) may remain covered by hard mask 220. FIG. 2 shows the remaining portion of hard mask 220 in phantom to illustrate an example where the ends of fins 206, 208, 210 are exposed after patterning of hard mask 220 (in phantom). Oxidation region 302 (see FIG. 4) may include, for example, strap region 402 (see FIG. 5), portions of strap region 402 (see FIG. 5) including an end of fins 206, 208, 210. In another example not shown, oxidation region 302 (see FIG. 4) may include any other region in SRAM array 400 (see FIG. 5) desirable for reducing the width of a fin. Initial structure 200

(see FIG. 1), including hard mask 220 and the ends of fins 206, 208, 210 may be subjected to an oxidation process. As shown in FIG. 2, the oxidation process may reduce the initial width W (in phantom) of the exposed end portions of fins 206, 208, 210 within oxidation region 302 (see FIG. 4). The regions of fins 206, 208, 210 covered by hard mask 220, including initial width W, are illustrated FIG. 2 in phantom. FIG. 2 shows reduced width W2 of the exposed end portions of fins 206, 208, 210 after oxidation. The reduced width W2 of the exposed end portions of fins 206, 208, 210 where the exposed end portions are located within strap region 402 (see FIG. 5) of SRAM array 400 (see FIG. 5) may result for example in an increased threshold voltage of strap region bit transistors and thereby reducing the low voltage fail count for adjacent strap region bitcells (see FIG. 5, adjacent strap region bitcell 410). Reduced width W2 may include a reduction, for example, of approximately 0.5 nanometers to approximately 1 nanometer from initial width W (in phantom). Although not shown in FIG. 2, the remainder of hard mask 220 may then be removed by any now known or later developed semiconductor manufacturing techniques.

A second hard mask (not shown) may optionally be formed over substrate 202 including fin array 204 before forming hard mask 220 (in phantom). Hard mask 230 may be formed, for example, by deposition or any other now known or later developed technique for forming hard masks in semiconductor manufacturing. The second hard mask (not shown) may be formed to cover any desirable portion of fins 206, 208, 210, for example by deposition and/or etching. The second hard mask (not shown) may for example remain intact, including within oxidation region 302 (see FIG. 4) after patterning hard mask 220. The second hard mask (not shown) may prevent reduction of initial fin width W of fins 206, 208, 210 where the hard mask covers the fins, for example including a portion of the exposed end portions of fins 206, 208, 210.

In another example, not shown, another hard mask may be formed over additional components of the SRAM array 400 (see FIG. 5) to protect the components during the oxidation of exposed end portions of fins 206, 208, 210. In an example not shown, a hard mask may be positioned over, for example, pull up (PU) transistors of the bitcells in strap region 402 (see FIG. 5).

The term "mask" may be given to a layer of material which is applied over an underlying layer of material, and patterned to have openings, so that the underlying layer can be processed where there are openings. After processing, the mask may be removed. Common masking materials may include, for example, nitride, oxide, low-k or high-k dielectrics. The mask may include varying thickness.

At this point, the remainder of the semiconductor structure would then be formed, by conventional processing, and termination boundaries (e.g. boundaries 412, 414 of FIG. 5) of the SRAM array 400 (see FIG. 5) established, for example by "strap" design techniques.

Figure 3:
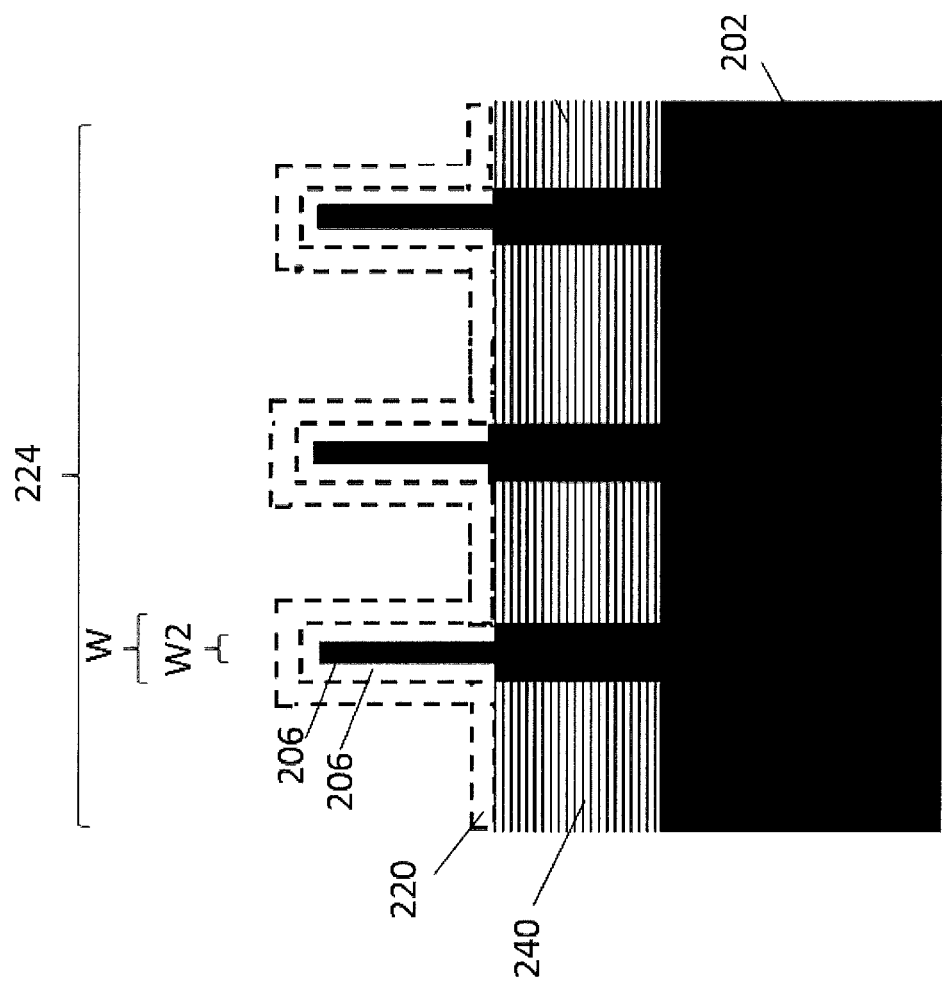
FIG. 3 shows a cross-sectional view of the portion of the initial semiconductor structure of FIG. 1 including forming shallow trench isolations (STIs) and reducing the width of a portion of a set of fins in a strap region according to embodiments of the disclosure.

As shown in FIG. 3, in contrast to conventional processing, an embodiment of the disclosure may include a second reduction of the width exposed end portions of fins 206, 208, 210, after formation of STIs 240, 242. In one example, second reduction of the width of exposed end portions of fins 206, 208, 210 may be performed in addition to the first reduction of initial width W of exposed end portions of fins 206, 208, 210 as described above with respect to FIG. 2 (i.e., the second reduction applied to reduced width W2 of exposed end portions of fins 206, 208, 210). In another example, the second reduction of the width of exposed end portions of fins 206, 208, 210 may be the only reduction of the width of exposed end portions of fins 206, 208, 210 (i.e., the second reduction applied to initial width W of exposed end portions of fins 206, 208, 210, and the first reduction described above with respect to FIG. 2 is not performed). FIG. 3 shows an example where the first reduction described above with respect to FIG. 2 is not performed, and the second reduction of width is applied to initial width W of exposed end portions of fins 206, 208, 210. As discussed above, in conventional processing, after initial structure 200 is formed, STIs 240, 242 may be formed between fins 206, 208, and fins 208, 210, respectively. Although four STIs are shown, it is understood that any number of STIs may be formed as may be desirable for SRAM array 400 (see FIG. 5). Although STIs 240 are shown covering approximately half of a height of fins 206, 208, 210, it is understood that STIs 240 may cover any desirable portion of the fins. STIs 240 may be formed by any now known or later developed techniques for forming STIs in a semiconductor structure. A hard mask 250 (in phantom) may be formed over initial structure 200, and STIs 240. Hard mask 250 (in phantom) may be formed, for example, by deposition or any other now known or later developed technique for forming hard masks in semiconductor manufacturing. Hard mask 250 (in phantom) may then be patterned to create an oxidation region 302 (see FIG. 4), for example over exposed end portions of fins 206, 208, 210 while remaining intact over the remainder of fins 206, 208, 210 of fin array 204. For example, fins 206, 208, 210 may include N fins, and P fins (not shown) may remain covered by hard mask 250 (in phantom). FIG. 3 shows the remaining portion of hard mask 250, after patterning, in phantom to illustrate the example where the exposed end portions of fins 206, 208, 210 are not covered by hard mask 250. Oxidation region 302 (see FIG. 4) may include, for example, strap region 402 (see FIG. 5), and/or portions of strap region 402 (see FIG. 5) including exposed end portions of fins 206, 208, 210. In another example, not shown, oxidation region 302 (see FIG. 4) may include the three outermost fins in an array of fins of SRAM array 400 (see FIG. 5). In another example not shown, oxidation region 302 (see FIG. 4) may include any other region in SRAM array 400 (see FIG. 5) desirable for reducing the width of a fin. Initial structure 200, hard mask 250 (in phantom) and oxidation region 302 (see FIG. 4) including exposed end portions of fins 206, 208, 210 may be subjected to an oxidation process. As shown in FIG. 3, the oxidation process may reduce initial width W of exposed end portions of fins 206, 208, 210 within oxidation region 302 (see FIG. 4). As shown in FIG. 3, for example, STIs 240 may cover a portion of exposed end portions of fins 206, 208, 210, and may, for example, prevent a reduction in the initial width W of a bottom portion the exposed end portions of the fins. FIG. 3 shows the portions of fins 206, 208, 210 covered by hard mask 250 including initial width W after oxidation in phantom to illustrate the example where initial width W of exposed end portions of fins 206, 208, 210 is reduced to reduced width W2.

The reduced width W2 of exposed end portions of fins 206, 208, 210, where exposed end portions of fins 206, 208, 210 are located for example within strap region 402 (see FIG. 5) of SRAM array 400 (see FIG. 5), may result for example in an increased threshold voltage of strap region bit transistors and thereby reducing the low voltage fail count for adjacent strap bitcells (see FIG. 5, adjacent strap region bitcell 410). Reduced width W2 of exposed end portions of fins 206, 208, 210 may include a reduction, for example, of approximately 0.5 nanometers to approximately 1 nanometer from initial width W. Although not shown in FIG. 2, the remainder of hard mask 250 (in phantom) may then be removed by any now known or later developed semiconductor manufacturing techniques.

A second hard mask (not shown) may optionally be formed over initial structure 200 and STIs 240 before forming hard mask 250 (in phantom). The second hard mask (not shown) may be formed, for example, by deposition or any other now known or later developed technique for forming hard masks in semiconductor manufacturing. The second hard mask (not shown) may for example cover an additional portion of the height of exposed end portions of fins 206, 208, 210. For example, second hard mask (not shown) may be formed to cover any desirable portion of exposed end portions of fins 206, 208, 210, for example by deposition and/or planarizing. The second hard mask (not shown) may for example remain intact after patterning hard mask 250 to form oxidizing region 302 (see FIG. 4) to create exposed end portions of fins 206, 208, 210. The second hard mask (not shown) may prevent reduction of initial width W of a portion of exposed end portions of fins 206, 208, 210, where the second hard mask covers the exposed end portions of the fins.

In another example, not shown, another hard mask may be formed over additional components of the SRAM array (see FIG. 5) to protect the components during the oxidation of exposed end portions of fins 206, 208, 210. In an example not shown, a hard mask may be positioned over, for example, pull up (PU) transistors of the bitcells in strap region 402 (see FIG. 5).

At this point, the remainder of the semiconductor structure would then be formed, by conventional processing, and termination boundaries (e.g. boundaries 412, 414 of FIG. 5) of the SRAM array 400 (see FIG. 5) established, for example by "strap" design techniques.

For example, after forming STIs 240 and/or after the second reduction of width W of fin 206, a dummy gate stack (e.g. see dummy gate stack 270, in phantom, FIG. 4) may be formed over a portion of fin array 204, spacers (e.g. see spacers 280, 282 of FIG. 4) may be formed, source/drain regions (e.g. see source region 284, and drain region 286, FIG. 4) may be formed, the dummy gate stack may be removed, a replacement metal gate (RMG) process performed, and a dielectric layer formed. The dummy gate stack may be formed from any now known or later developed techniques for forming dummy gate stacks in semiconductor structures. The dummy gate stack may include for example polysilicon, and/or any other material desirable for forming the dummy gate stack. The spacers may be formed along the sidewalls of the dummy gate stack. The spacers may be formed by any now known or later developed technique for forming spacers in a semiconductor structure. A source region and a drain region may be formed from the exposed regions (e.g. see exposed regions 288, 290, FIG. 4) of fins 206, 208, 210 by epitaxial growth of an epitaxy layer (epi-layer), for example silicon germanium. The source region and the drain region may be formed from any now known or later developed techniques for forming source and/or drain regions in a semiconductor structure. As understood, the exposed regions of fins 206, 208, 210 may be doped, e.g., by ion implanting or in-situ doped as formed. As also known, a dopant element introduced into semiconductor can establish either p-type (acceptors) or n-type (donors) conductivity. Common dopants in silicon: for p-type—boron (B), indium (In); and for n-type—phosphorous (P) arsenic (As), antimony (Sb). Dopants are of two types—"donors" and "acceptors." N type implants are donors and P type are acceptors. The dummy gate stack may, for example, be removed after forming the source/drain regions. The dummy gate stack may be removed by any now known or later developed techniques for removing dummy gate stacks in a semiconductor structure. An RMG process may be performed according to conventional techniques, including for example, formation of a metal gate stack between the spacers. RMG process may include any now known or later developed semiconductor manufacturing techniques. A dielectric layer may be formed over the structure. Although steps have been described for conventional processing, it is understood that additional steps not herein described may be included in conventional processing.

As shown in FIG. 4, in contrast to conventional processing, an embodiment of the disclosure may further include a third reduction of the width of exposed end portions of fins 206, 208, 210, after removing a dummy gate stack 270 (in phantom) during a replacement metal gate process. In one example, third reduction of the width of exposed end portions of fins 206, 208, 210 may be performed in addition to the first reduction of the width of exposed end portions of fins 206, 208, 210 as described above with respect to FIG. 2 and/or the second reduction of the width of exposed end portions of fins 206, 208, 210 as described above with respect to FIG. 3. In another example, the third reduction of the width of exposed end portions of fins 206, 208, 210 may be the only reduction of the width of exposed end portions of fins 206, 208, 210 (i.e. the third reduction applied to initial width W of exposed end portions of fins 206, 208, 210, and the first reduction of width described above with respect to FIG. 2 and the second reduction of width described above with respect to FIG. 3 are not performed). FIG. 4 shows an example where the first reduction of width and the second reduction of width are not performed, and the third reduction of width is applied to initial width W of exposed end portions of fins 206, 208, 210.

FIG. 4 shows reducing the initial width W of exposed end portions of fins 206, 208, 210 to reduced width W2. A hard mask (not shown) may be formed over the structure shown in FIG. 4, including substrate 202, fin array 204, spacers 280, 282, STIs (not shown), etc. The hard mask may be formed, for example, by deposition or any other now known or later developed technique for forming hard masks in semiconductor manufacturing. The hard mask may then be patterned to create an oxidation region 302, for example over exposed end portions of fins 206, 208, 210 while remaining intact over the remainder of fins 208, 210 of fin array 204. For example, fins 206, 208, 210 may include N fins, and P fins (not shown) may remain covered by the hard mask. Oxidation region 302 may include, for example, strap region 402 (see FIG. 5), and/or portions of strap region 402 (see FIG. 5) including exposed end portions of fins 206, 208, 210. In another example, not shown, oxidation region 302 may include the three outermost fins in an array of fins of SRAM array 400 (see FIG. 5). In another example not shown, oxidation region 302 may include any other region in SRAM array 400 (see FIG. 5) desirable for reducing the width of a fin. As shown in FIG. 4, the oxidation process may reduce initial width W of exposed end portions of fins 206, 208, 210 which is exposed within oxidation region 302. Although fins 206, 208, 210 are completely visible in the example of FIG. 4, it is understood that STIs (e.g. STIs 240, see FIG. 3) may be present along the sides of the fins. Reduced width W2 of exposed end portions of fins 206, 208, 210, where exposed end portions of fins 206, 208, 210 are located for example within strap region 402 (see FIG. 5) of SRAM array 400 (see FIG. 5) may result for example in an increased threshold voltage of strap region bit transistors and thereby reducing the low voltage fail count for adjacent strap bitcells (see FIG. 5, adjacent strap region bitcell 410). Reduced width W2 of exposed end portions of fins 206, 208, 210 may include a reduction, for example, of approximately 0.5 nanometers to approximately 1 nanometer from initial width W. Oxidation region 302 including exposed end portions of fins 206, 208, 210 may for example be optionally exposed to hydrofluoric acid (HF) after the oxidation process to reduce initial width W and before removing the remainder of hard mask 300 (not shown). The remainder of hard mask 300 (not shown) may then be removed by any now known or later developed semiconductor manufacturing techniques. While a particular number of dummy gate stacks, source/drain regions, exposed end portions of fins, fins, etc. are shown, it is understood that any number of components desired for SRAM array 400 (see FIG. 5) may be incorporated.

A second hard mask (not shown) may optionally be formed over fin array 204 before forming hard mask 300 (not shown). The second hard mask (not shown) may be formed, for example, by deposition or any other now known or later developed technique for forming hard masks in semiconductor manufacturing. The second hard mask (not shown) may for example cover approximately half of the height of fins 206, 208, 210 including exposed end portions of fins 206, 208, 210. Alternatively, for example, second hard mask (not shown) may be formed to cover any desirable portion of the height of fins 206, 208, 210, for example by deposition and/or planarizing. The second hard mask (not shown) may for example remain intact after patterning hard mask 300 (not shown) to form oxidizing region 302. The second hard mask (not shown) may prevent reduction of initial width W of a portion of exposed end portions of fins 206, 208, 210 where the hard mask covers the exposed end portions of fins 206, 208, 210.

In another example, not shown, another hard mask may be formed over additional components of the SRAM array (see FIG. 5) to protect the components during the oxidation of exposed end portions of fins 206, 208, 210. In an example not shown, a hard mask may be positioned over, for example, pull up (PU) transistors of the bitcells in strap region 402 (see FIG. 5).

At this point, the remainder of the semiconductor structure would then be formed, by conventional processing (by any now known or later developed semiconductor manufacturing techniques), and termination boundaries (e.g. boundaries 412, 414 of FIG. 5) of the SRAM array 400 (see FIG. 5) established, for example by "strap" design techniques.

Although not shown in FIG. 4, additional processing steps and/or changes can be performed where oxidation regions 302 includes strap region 402 (see FIG. 5) of SRAM array 400 (see FIG. 5), in order to, for example, reduce the low voltage fail count for adjacent strap region bitcells. In one example not shown, the width of metal gate stack 292 over fin 206 may be increased during processing. In another example not shown, the width of spacers 280, 282 along the sidewalls of metal gate stack 292 may be increased. In another example not shown, the thickness of source/drain regions 284, 286 of fins 206, 208, 210 may be decreased. In another example not shown, a higher work-function metal on the pull down (PD) and pass gate (PG) and/or higher halo implant for the pull down (PD) and pass gate (PG) may be implemented, for example to slow down the PD and PG.

FIG. 5 shows an SRAM array 400 including fin array 204, fins 206, 208, 210, strap region 402, adjacent strap region bitcell 410, and boundaries 412, 414. As discussed above, termination boundaries, for example boundaries 412, 414 may be established towards the end of the conventional processing of SRAM array 400. The conventional SRAM array termination technique, "strap" design, for example strap region 402, are incorporated to preserve bitcell layout consistency and homogeneity in the electrical characteristics of the bitcells of the devices. One result of termination by strap design includes a systematic device offset, e.g., systematic strap proximity effect (SPE), which includes increased read currents in bitcells near the strap (e.g. strap region 402), lowers cell stability, lowers pull down (PD) and/or pass gate (PG) threshold voltage (VT) and increases low voltage fail count for adjacent strap region bitcells, for example adjacent strap region bitcell 410.

According to embodiments of the disclosure, as discussed above, reducing the width of an exposed end portion of at least one fin within strap region 402 may for example increase the Vt and decrease low voltage fail count for adjacent strap bitcells. For example, initial width W of exposed end portions of fins 206, 208, 210 within strap region 402 may be reduced by the fin width reduction processes described herein. Oxidation region 302 (see FIG. 4) including exposed end portions of fins 206, 208, 210 described above, may include for example strap region 402. In another example, strap region 402 may include the three outermost fins of SRAM array 400. In one example first reduction of initial width W of exposed end portions of fins 206, 208, 210 as shown in FIG. 1, the second reduction of initial width W of exposed end portions of fins 206, 208, 210 as shown in FIG. 2, and the third reduction of initial width W of exposed end portions of fins 206, 208, 210 as shown in FIG. 3 may be performed independently to reduce initial width W of 206. For example only the second reduction of initial width W of exposed end portions of fins 206, 208, 210 in addition to conventional processing of SRAM array 400. In another example, first reduction of initial width W of exposed end portions of fins 206, 208, 210 as shown in FIG. 1, the second reduction of the width as shown in FIG. 2, and the third reduction of width as shown in FIG. 3 may be performed in any combination. For example, first fin width reduction (see FIG. 1), second fin width reduction (see FIG. 2) and third fin width reduction (see FIG. 3) may all be performed in addition to conventional processing of SRAM array 400 (see FIG. 5). In another example, first fin width reduction (see FIG. 1) and third fin width reduction (see FIG. 3) may be formed in addition to conventional processing of SRAM array 400. It is understood that SRAM array 400 may include any semiconductor manufacturing device including a fin.

Figure 6:
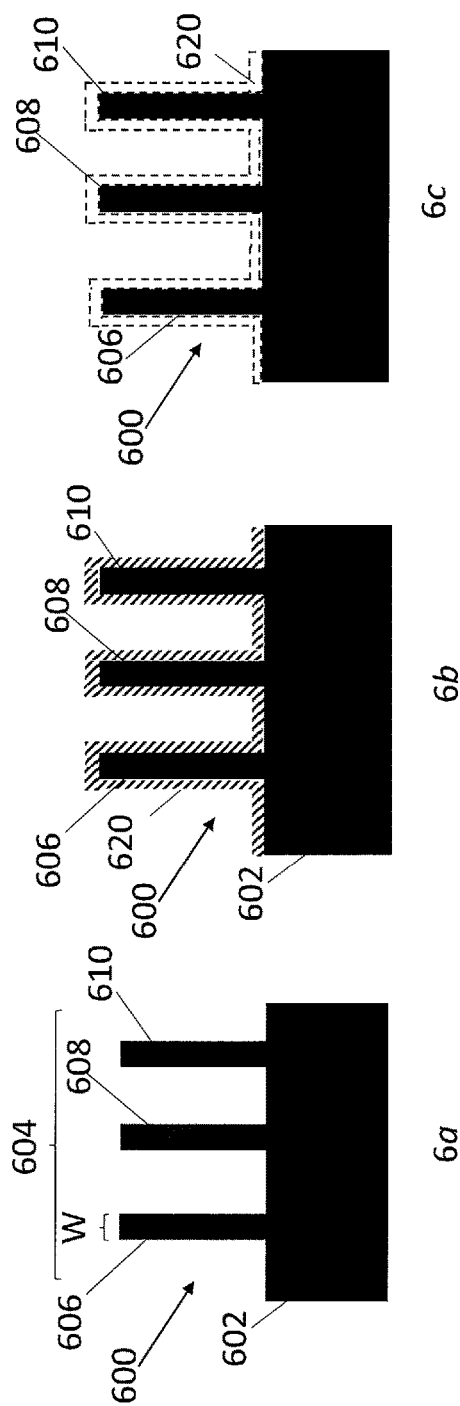
FIG. 6 shows an example process of reducing the width of a portion of a set of fins in a strap region including steps 6a-e according to embodiments of the disclosure.

FIG. 6 shows an example process for reducing the width of exposed end portions of fins. FIG. 6a shows an initial structure 600 including substrate 602, and fin array 604 including fins 606, 608, 610. Fins 606, 608, 610 may for example include only N fins. Fins 606, 608, 610 may include an initial width W. FIG. 6b shows formation of hard mask 620 over initial structure 600. While hard mask 620 is shown to completely cover fins 606, 608, 610, hard mask 620 may be formed to cover any desirable portion of fins 606, 608, 610. FIG. 6c illustrates removing a portion of hard mask 620, for example, over exposed end portions of fins 606, 608, 610 to create oxidation region 302 (see FIG. 4) and exposing exposed end portions of fins 606, 608, 610. FIG. 6c shows the portion of hard mask 620 not removed, in phantom. FIG. 6d shows the result of oxidizing the structure including exposed end portions of fins 606, 608, 610. For example, initial width W of exposed end portions of fins 606, 608, 610 may be reduced to reduced width W2. FIG. 6d shows the remaining portion of hard mask 620, and initial width W of the portions of fins 606, 608, 610 covered by hard mask 620 during oxidation, in phantom. FIG. 6e shows initial structure 600 including exposed end portions of fins 606, 608, 610 with reduced width W2, and portions of fins 606, 608, 610 with initial width W in phantom, after removal of the remainder of hard mask 620.

Figure 7:
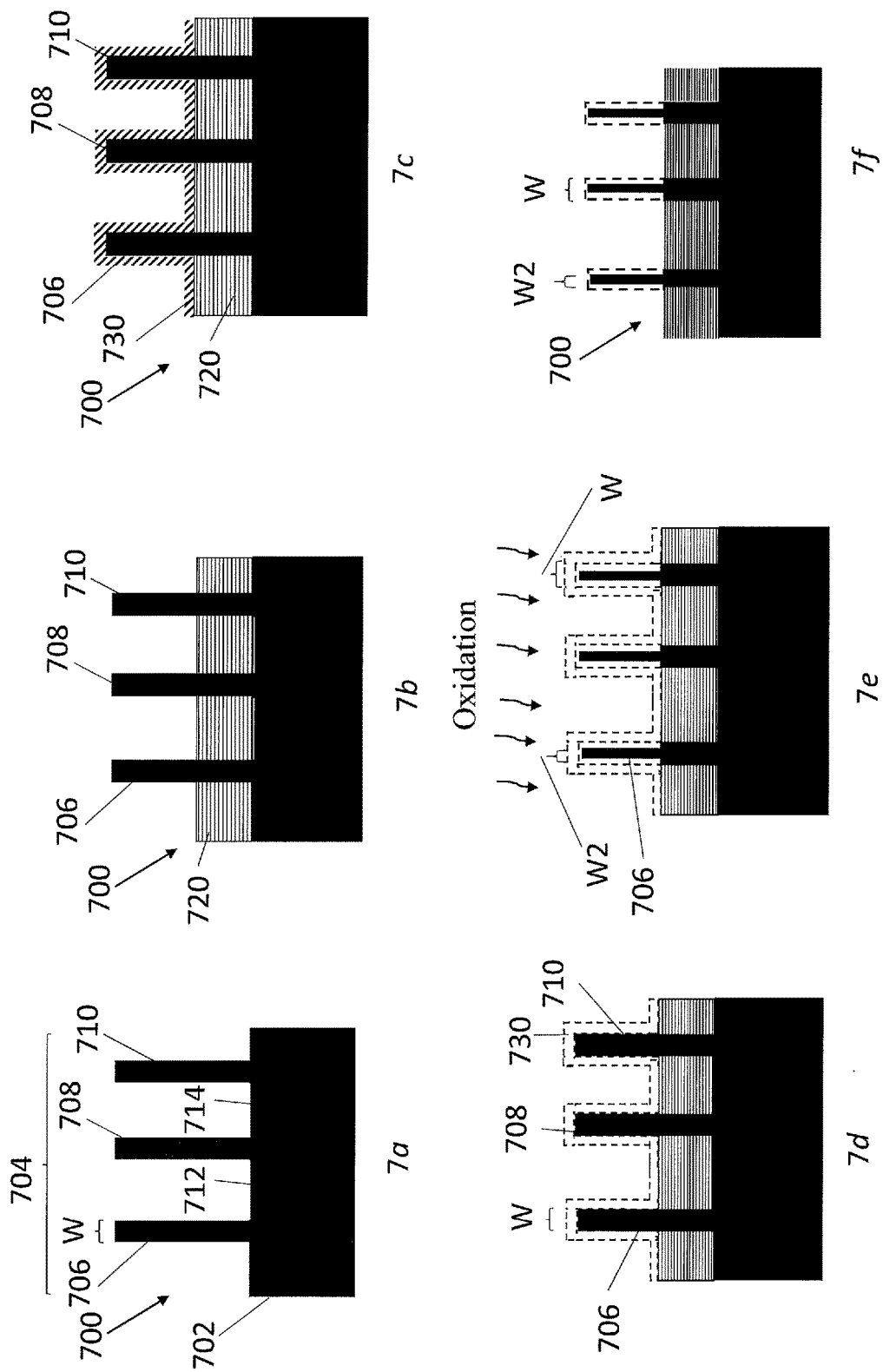
FIG. 7 shows another example process of reducing the width of a portion of a set of fins in a strap region including steps 7a-f according to embodiments of the disclosure.

FIG. 7 shows an example process for reducing the width of exposed end portions of fins. The example process shown in FIG. 7 may for example be performed as the first reduction process on an array of fins, or as a second reduction process on an array of fins with for example a width of a portion of at least one fin previously reduced by a first reduction process. In the example of FIG. 7, the fin width reduction process example is shown as a first width reduction process performed on the fin array. FIG. 7a shows an initial structure 700 including substrate 702, fin array 704 including fins 706, 708, 710. Fins 706, 708, 710 may for example include only N fins. Fins 706, 708, 710 may include an initial width W. FIG. 7b shows formation of STIs 720 over initial structure 700, between fins 706, 708, 710. While STIs 720 are shown to cover approximately half of a height of the fins, it is understood that STIs 720 may be formed to cover any desirable portion of fins 706, 708, 710. FIG. 7c shows formation of a first hard mask 730 over initial structure 700 and STIs 720. While first hard mask 730 is shown to completely cover the remainder of fins 706, 708, 710, first hard mask 730 may be formed to cover any desirable portion of fins 706, 708, 710. FIG. 7d shows removing a portion of first hard mask 730 (in phantom), for example, over an end portion of fins 706, 708, 710 to create oxidation region 302 (see FIG. 4) and creating exposed end portions of fins 706, 708, 710. FIG. 7d shows the remaining portion of first hard mask 730 in phantom. FIG. 7e shows the result of oxidizing the structure including oxidation region 302 (see FIG. 4). For example, initial width W of exposed end portions of fins 706, 708, 710 may be reduced to reduced width W2 where first hard mask 730 is not covering exposed end portions of fins 706, 708, 710. FIG. 7e shows the remaining portion of first hard mask 730, and portions of fins 706, 708, 710 covered by second hard mask (not shown) during oxidation including initial width W, in phantom. FIG. 7f shows initial structure 700 including exposed end portions of fins 706, 708, 710 including reduced width W2 after removal of the remainder of first hard mask 730. FIG. 7f shows the portions of fins 706, 708, 710 covered by first hard mask 730 during oxidation including initial width W after removal of the remainder of first hard mask, in phantom.

Figure 8:
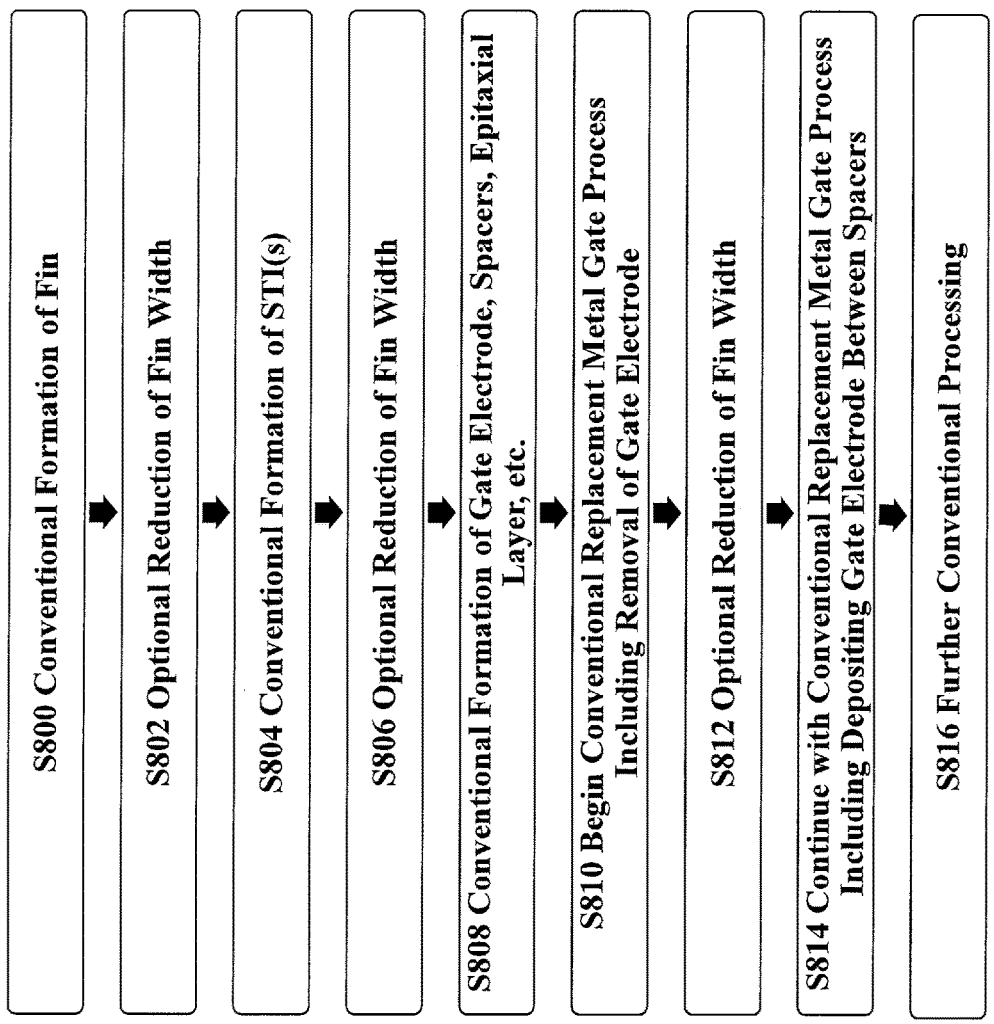
FIG. 8 shows a flow diagram of example optional fin width reduction processes throughout manufacturing of an SRAM bitcell array according to embodiments of the disclosure.

FIG. 8 shows an example flow diagram of optional fin width reduction processes throughout the manufacturing of SRAM array 400 (see FIG. 5). Step S800 may include, for example, conventional formation of initial structure 200 (see FIG. 1) including fins 206, 208, 210 (see FIG. 1). Step S802 may include a first optional fin width reduction after formation of the fins, as illustrated in FIGS. 2 and 6. Step S804 may include conventional formation of shallow trench isolations (STIs). Step S804 may be performed for example after step S800, or after optional step S802. Step S806 may include a second optional fin width reduction after formation of STIs, for example, the fin width reduction illustrated in FIGS. 3 and 7. Step S806 may be performed, for example, after steps S800 and S804, or after steps S800, S802, and S804. Step S808 may include conventional formation of a gate electrode, spacers, epitaxial layer, etc., after step S804 and/or S806. Step S810 may include for example a beginning set of steps for a replacement metal gate (RMG) process. For example, step S810 may include RMG steps up until removal of the gate electrode, (see e.g. dummy gate stack 270, FIG. 4). Step S812 may include a third option reduction of fin width, for example the fin width reduction illustrated in FIG. 4. For example step S812 may be performed after steps S800, S804, S808, and S810. For example step S812 may be performed after steps S800, S802, S804, S808, and S810. For example step S812 may be performed after steps S800, S804, S806, S808, and S810. In another example, step S812 may be performed after steps S800, S802, S804, S806, S808, and S810. Step S814 may include the remainder of the RMG process, for example, depositing a gate electrode between spacers formed in step S808. Step S814 may be performed after step S810 and/or S812. Step S816 may include, for example, further conventional processing of SRAM array 400 (see FIG. 5).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of reducing fin width in an integrated circuit (IC), the method comprising:
   oxidizing an exposed portion of at least one fin in an array of fins, wherein a first hard mask is located over the array of fins except the exposed portion of the at least one fin, and wherein the oxidizing reduces a width of the exposed portion of the at least one fin,
   wherein oxidizing the exposed portion of the at least one fin occurs after removing a dummy gate during a replacement metal gate process.

2. The method of claim 1, wherein the oxidizing the exposed portion of the at least one fin occurs before forming a shallow trench isolation (STI) between pairs of fins in the array of fins.

3. The method of claim 1, wherein the oxidizing the exposed portion of the at least one fin occurs after forming a shallow trench isolation (STI) between pairs of fins in the array of fins.

4. The method of claim 1, wherein the exposed portion of the at least one fin is an end of the at least one fin located in a strap region of the array of fins.

5. The method of claim 1, wherein the at least one fin is one of a set of three outermost fins of the array of fins.

6. The method of claim 1, wherein the at least one fin includes an N-type fin.

7. The method of claim 1, further comprising forming a second hard mask over the array of fins and under the first hard mask, wherein the second hard mask covers a portion of a height of the exposed portion of the at least one fin.

8. A method of reducing fin width in an integrated circuit (IC), the method comprising:
   forming a shallow trench isolation (STI) between pairs of fins of an array of fins in a substrate;
   forming a dummy gate stack over a portion of the array of fins;
   forming a set of spacers along a first sidewall and a second sidewall of the dummy gate;
   epitaxially growing an epitaxial layer over the dummy gate stack;
   forming a source region and a drain region in each fin of the array of fins;
   removing the dummy gate stack;
   forming a first hard mask over the array of fins;
   removing a portion of the first hard mask to expose an exposed end portion of at least one fin of the array of fins, wherein the exposed end portion of the at least one fin is located within a strap region of the array of fins;
   oxidizing the exposed end portion of the at least one fin, wherein the oxidizing causes a first reduction in a width of the exposed end portion of the at least one fin; and
   removing a remaining portion of the hard mask from the array of fins.

9. The method of claim 8, further comprising depositing a second hard mask over the array of fins before the depositing the first hard mask over the array of fins, wherein the second hard mask covers a portion of a height of the exposed end portion of the at least one fin after the removing a portion of the first hard mask.

10. The method of claim 8, wherein the forming the set of spacers includes increasing a critical dimension of the set of spacers within a strap region of the array of transistors.

11. The method of claim 8, wherein the epitaxially growing the epitaxial layer includes decreasing a width of the epitaxial layer within a strap region of the array of transistors.

12. The method of claim 8, wherein the forming the dummy gate stack includes increasing a critical dimension of the dummy gate stack within a strap region of the array of transistors.

13. The method of claim 8, further comprising:
   forming a set of shallow trench isolations (STIs) in the substrate after the removing the remaining portion of the first hard mask, wherein each STI of the set of STIs is located between pairs of fins the array of fins;
   after forming the set of STIs, forming a second hard mask over the array of fins;
   removing a portion of the second hard mask to expose the exposed end portion of the at least one fin of the array of fins, wherein the exposed end portion of the at least one fin is located within a strap region of the array of fins;
   oxidizing the exposed end portion of the at least one fin, wherein the oxidizing causes a second reduction in the width of the exposed end portion of the at least one fin; and
   removing a remaining portion of the second hard mask.

14. A method of reducing fin width in an integrated circuit (IC), the method comprising:
   forming a first hard mask over an array of fins of a substrate;
   removing a portion of the first hard mask to expose an exposed end portion of at least one fin of the array of fins, wherein the exposed end portion of the at least one fin is located within a strap region of the array of fins;
   oxidizing the exposed end portion of the at least one fin, wherein the oxidizing causes a first reduction in a width of the exposed end portion of the at least one fin;
   removing a remaining portion of the hard mask from the array of fins;
   forming a set of shallow trench isolations (STIs) in the substrate after the removing the remaining portion of the first hard mask, wherein each STI of the set of STIs is located between pairs of fins the array of fins;
   after forming the set of STIs, forming a second hard mask over the array of fins;
   removing a portion of the second hard mask to expose the exposed end portion of the at least one fin of the array of fins, wherein the exposed end portion of the at least one fin is located within a strap region of the array of fins;
   oxidizing the exposed end portion of the at least one fin, wherein the oxidizing causes a second reduction in the width of the exposed end portion of the at least one fin; and
   removing a remaining portion of the second hard mask.

* * * * *